(12) United States Patent
Huang et al.

(10) Patent No.: US 7,071,115 B2
(45) Date of Patent: Jul. 4, 2006

(54) USE OF MULTIPLE ETCHING STEPS TO REDUCE LATERAL ETCH UNDERCUT

(75) Inventors: Chunchieh Huang, Fremont, CA (US); Chia-Shun Hsiao, Cupertino, CA (US); Jin-Ho Kim, San Jose, CA (US); Kuei-Chang Tsai, Cupertino, CA (US); Barbara Haselden, Cupertino, CA (US); Daniel C. Wang, San Jose, CA (US)

(73) Assignee: ProMOS Technologies Inc., Hsin Chu (TW)

(*) Notice: Subject to any disclaimer, the term of this patent is extended or adjusted under 35 U.S.C. 154(b) by 60 days.

(21) Appl. No.: 10/772,932

(22) Filed: Feb. 4, 2004

(65) Prior Publication Data

US 2005/0170646 A1 Aug. 4, 2005

(51) Int. Cl.
*H01L 21/302* (2006.01)
*H01L 21/461* (2006.01)
*H01L 21/44* (2006.01)
*H01L 21/76* (2006.01)

(52) U.S. Cl. .................. 438/717; 438/736; 438/671; 438/401; 438/448

(58) Field of Classification Search ............... 438/671, 438/717, 736, 401, 445, 448, 462, 546
See application file for complete search history.

(56) References Cited

U.S. PATENT DOCUMENTS

| | | | | |
|---|---|---|---|---|
| 4,981,550 A | * | 1/1991 | Huttemann et al. | 438/672 |
| 5,604,156 A | * | 2/1997 | Chung et al. | 438/620 |
| 5,893,744 A | * | 4/1999 | Wang | 438/401 |
| 6,355,524 B1 | | 3/2002 | Tuan et al. | |
| 6,403,417 B1 | | 6/2002 | Chien et al. | |
| 6,451,708 B1 | | 9/2002 | Ha | |
| 6,541,324 B1 | | 4/2003 | Wang | |
| 2003/0067806 A1 | | 4/2003 | Tuan | |

OTHER PUBLICATIONS

Naruke, K.; Yamada, S.; Obi, E.; Taguchi, S.; and Wada, M. "A New Flash-Erase EEPROM Cell with A Sidewall Select-Gate On Its Source Side," 1989 IEEE, pp. 604-606.

(Continued)

*Primary Examiner*—Chuong A. Luu
(74) *Attorney, Agent, or Firm*—Michael Shenker; MacPherson Kwok Chen & Heid LLP

(57) ABSTRACT

In integrated circuit fabrication, an etch is used that has a lateral component. For example, the etch may be isotropic. Before the isotropic etch of a layer (160), another etch of the same layer is performed. This other etch can be anisotropic. This etch attacks a portion (160X2) of the layer adjacent to the feature to be formed by the isotropic etch. That portion is entirely or partially removed by the anisotropic etch. Then the isotropic etch mask (420) is formed to extend beyond the feature over the location of the portion subjected to the anisotropic etch. If that portion was removed entirely, then the isotropic etch mask may completely seal off the feature to be formed on the side of that portion, so the lateral etching will not occur. If that portion was removed only partially, then the lateral undercut will be impeded because the passage to the feature under the isotropic etch mask will be narrowed.

12 Claims, 15 Drawing Sheets

OTHER PUBLICATIONS

Wu, A. T.; Chan T. Y.; Ko, P.K.; and Hu, C. "A Novel High-Speed, 5-Volt Programming EPROM Structure With Source-Side Injection," 1986 IEEE, 584-587.

Mizutani, Yoshihisa; and Makita, Koji "A New EPROM Cell With A Sidewall Floating Gate Fro High-Density and High Performance Device," 1985 IEEE, 635-638.

Ma, Y.; Pang, C.S.; Pathak, J.; Tsao, S.C.; Chang, C.F.; Yamauchi, Y.; Yoshimi, M. "A Novel High Density Contactless Flash Memory Array Using Split-Gate Source-Side-Injection Cell for 5V-Only Applications," 1994 Symposium on VLSI Technology Digest of Technical Papers, pp. 49-50.

Mih, Rebecca et al. "0.18um Modular Triple Self-Aligned Embedded Split-Gate Flash Memory," 2000 Symposium on VLSI Technology Digest of Technical Papers, pp. 120-121.

K. Naruke et al., "A New Flash-Erase EEPROM Cell with a Sidewall Select-Gate on Its Source Side", IEDM Technical Digest 1989, pp. 603-606.

U.S. Appl. No. 10/402,698, filed Mar. 28, 2003, Chung et al.

R. Mih et al., "0.18um Modular Triple Self-Aligned Embedded Split-Gate Flash Memory", 2000 Symposium on VLSI Technology, Digest of Technical Papers, pp. 120-121.

* cited by examiner

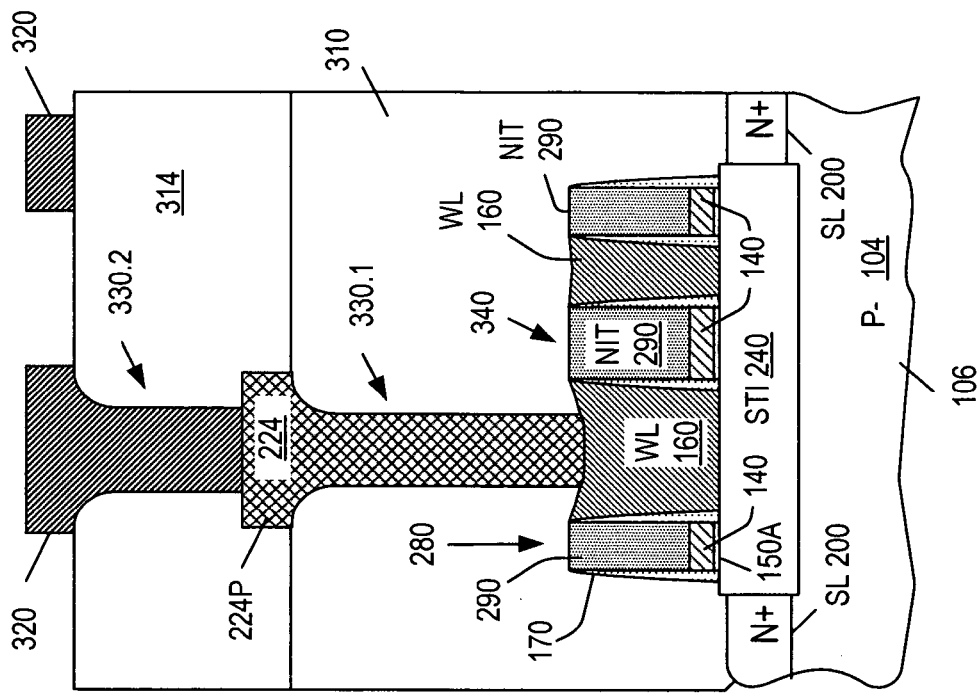
FIG. 2D (Y1-Y1')
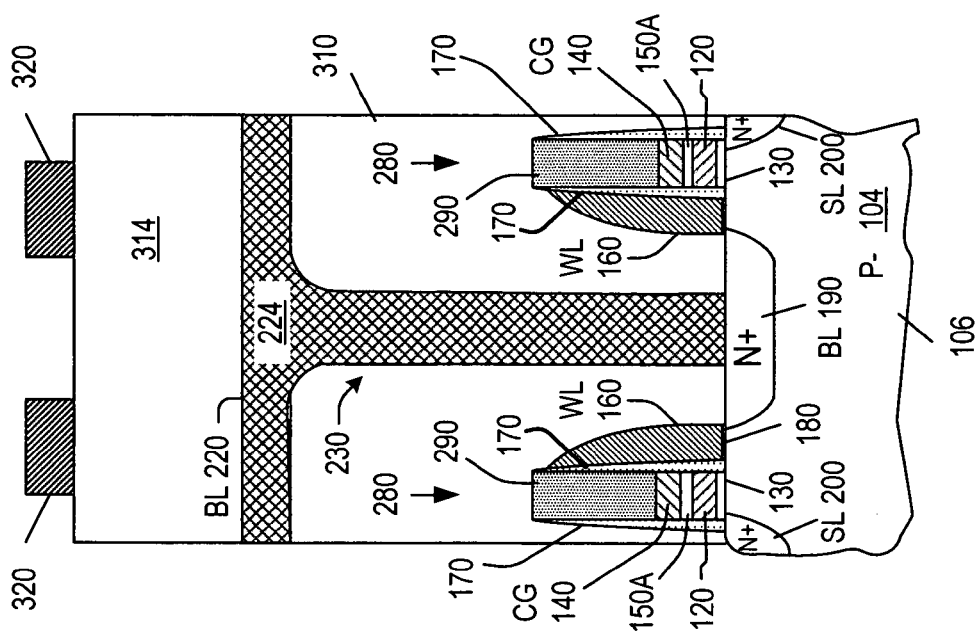
FIG. 2E (Y2-Y2')

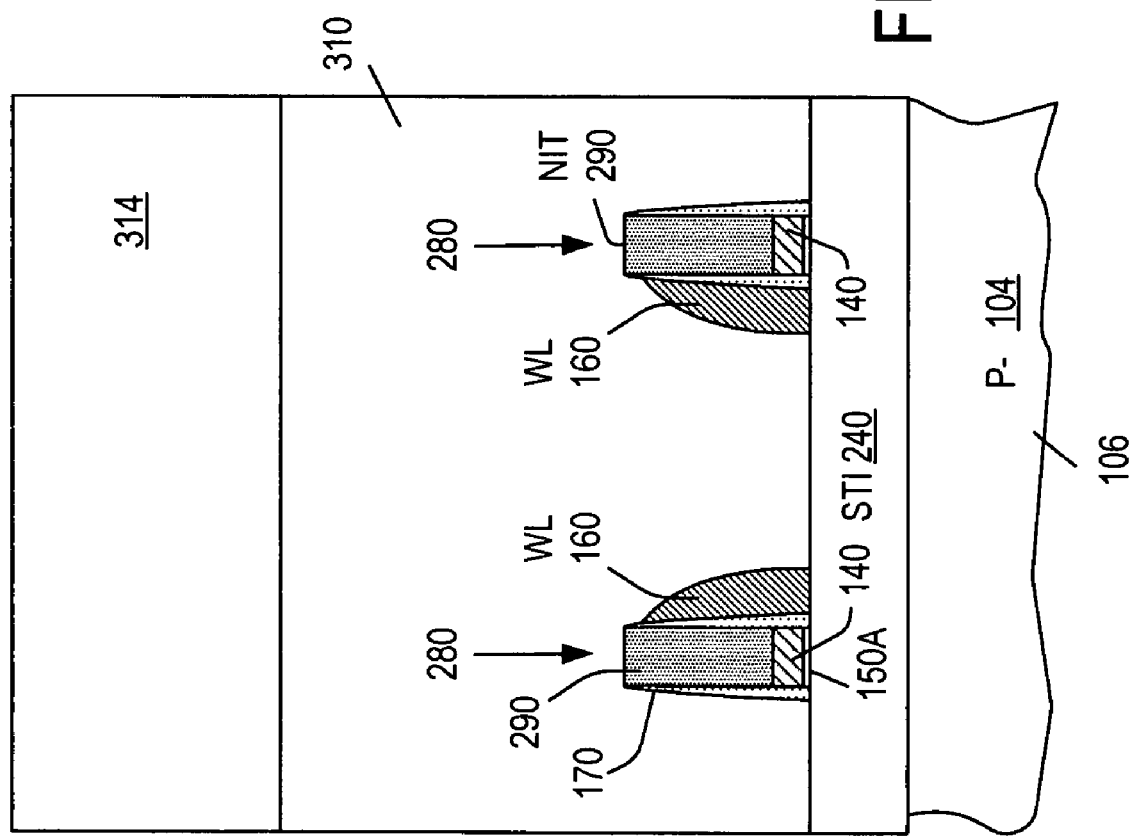
FIG. 2F (Y3-Y3')

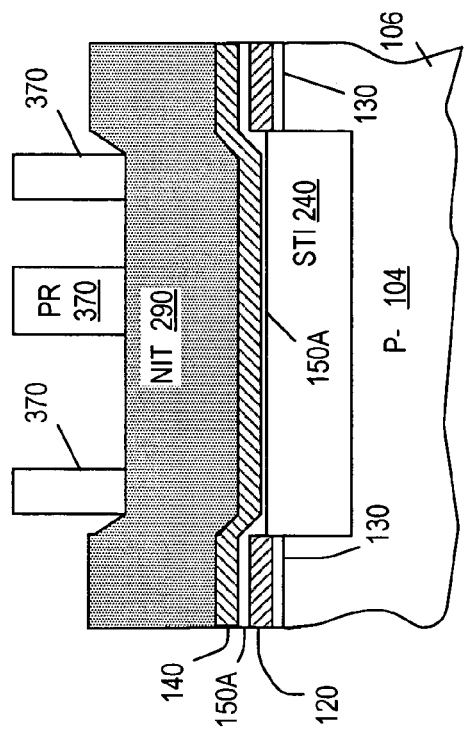
FIG. 4B (Y2-Y2')
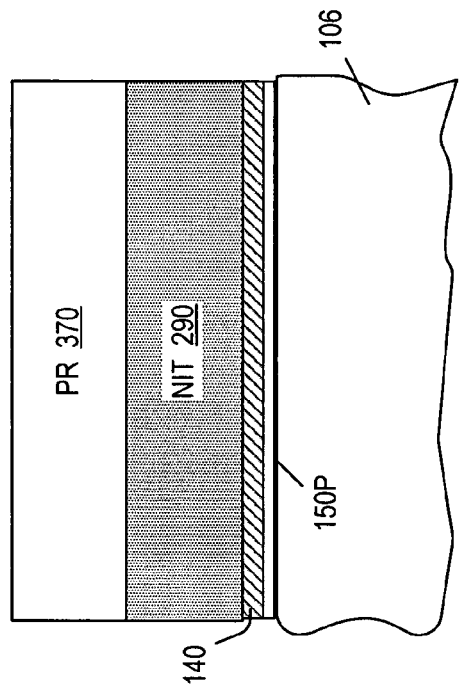
FIG. 4C (PERIPHERY)
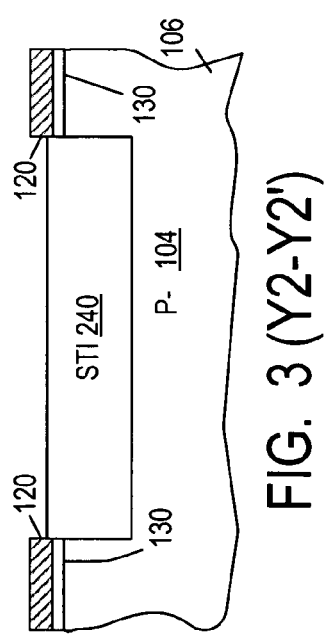
FIG. 3 (Y2-Y2')
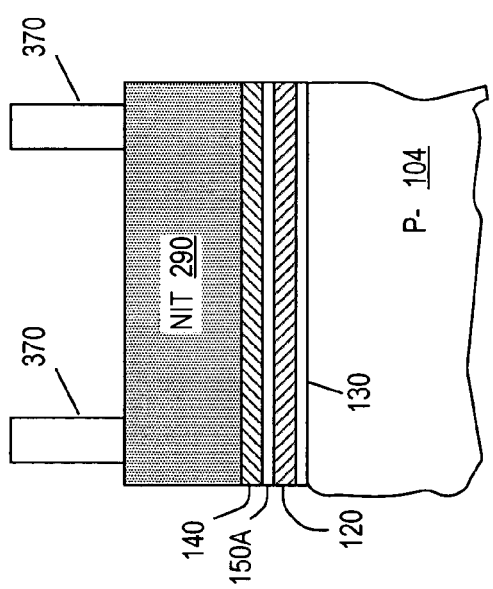
FIG. 4A (Y1-Y1')

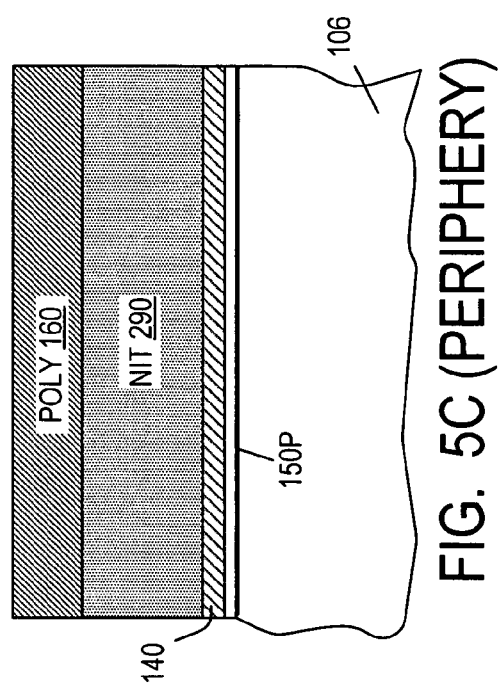
FIG. 5C (PERIPHERY)
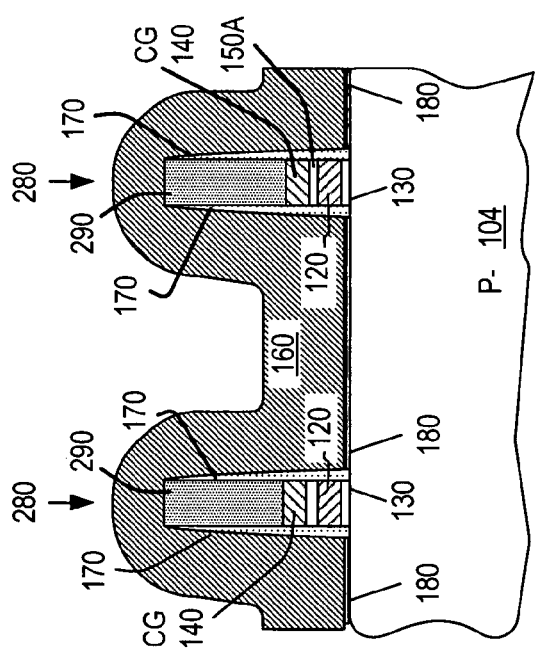
FIG. 5A (Y1-Y1')
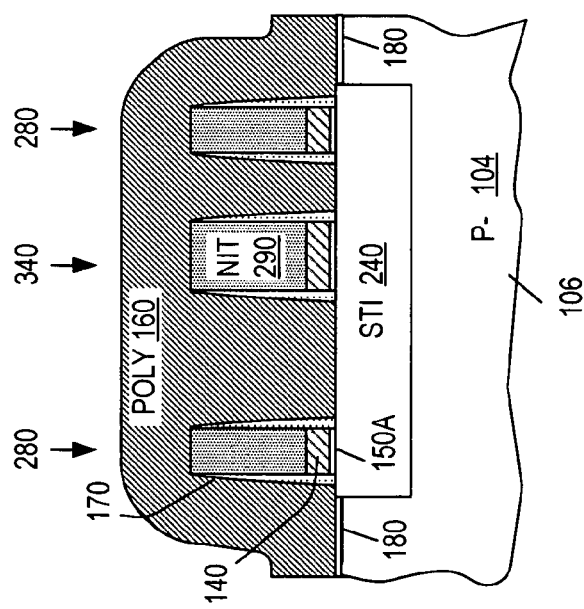
FIG. 5B (Y2-Y2')

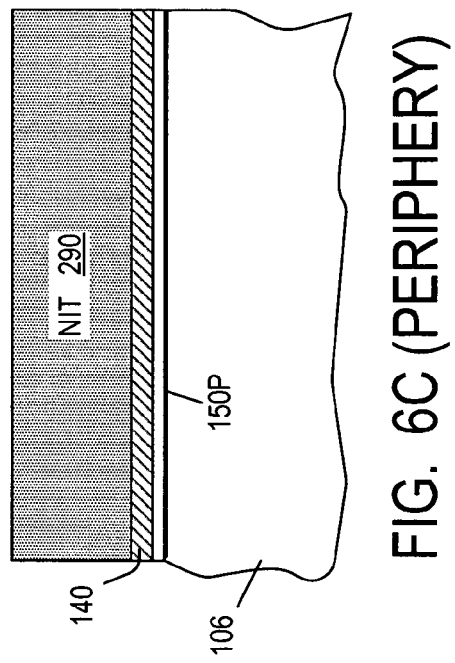
FIG. 6C (PERIPHERY)
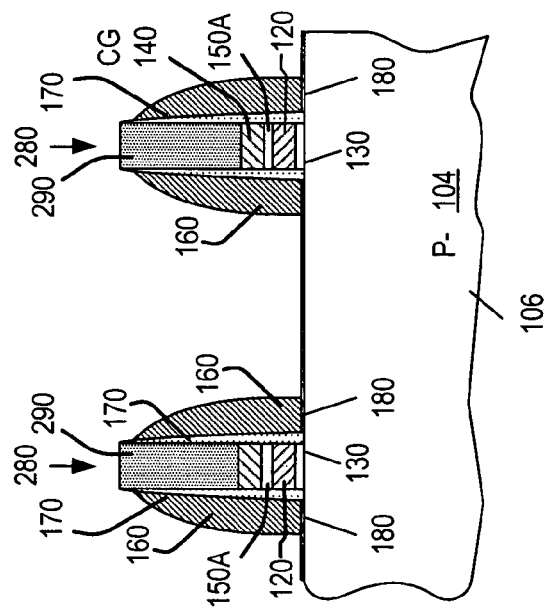
FIG. 6A (Y1-Y1')
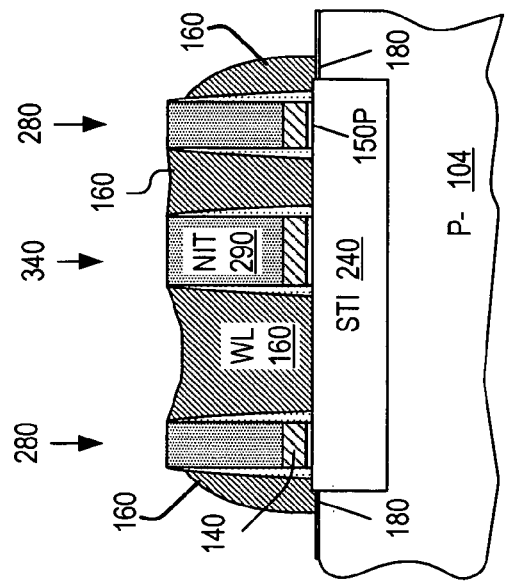
FIG. 6B (Y2-Y2')

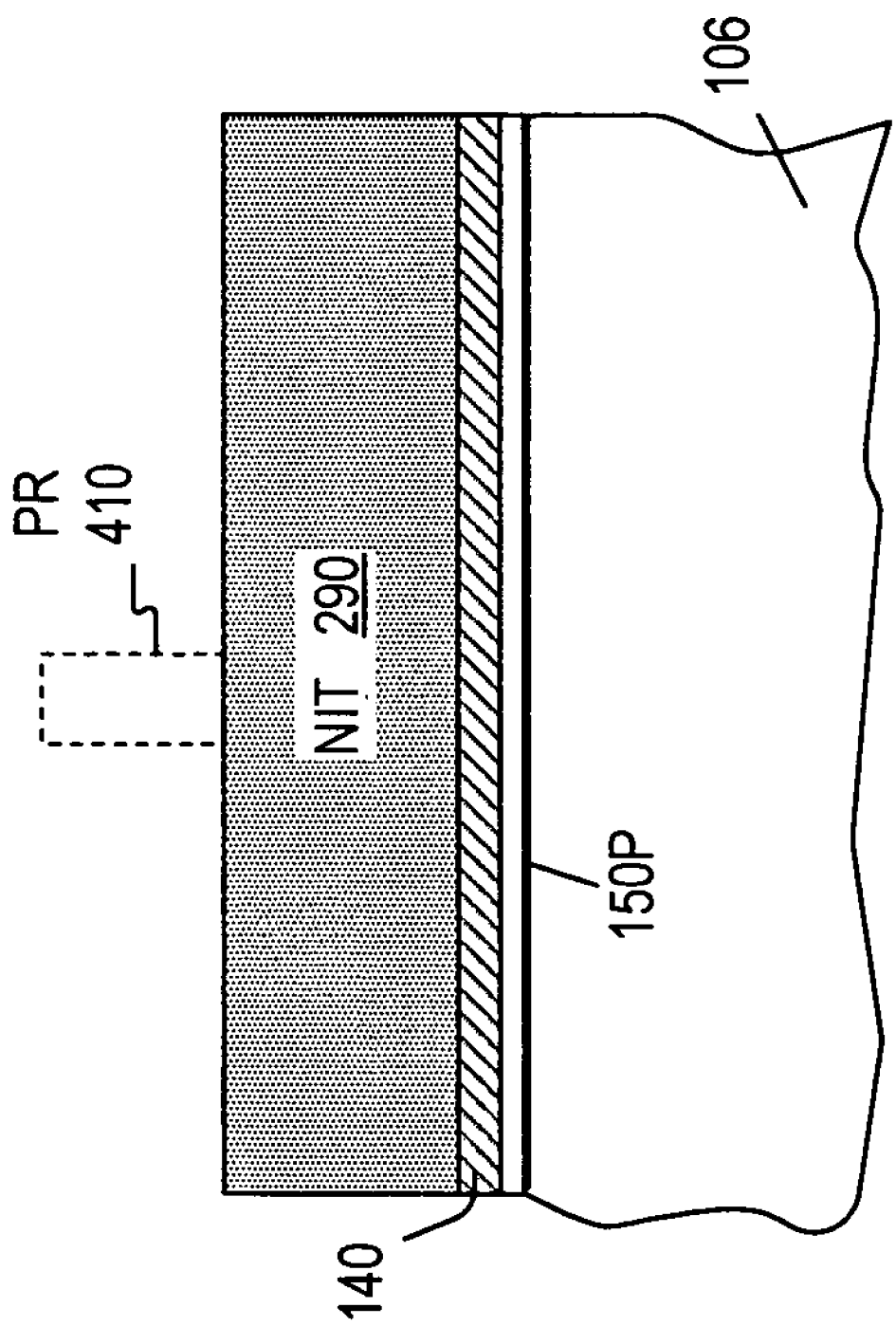
FIG. 7B (PERIPHERY)

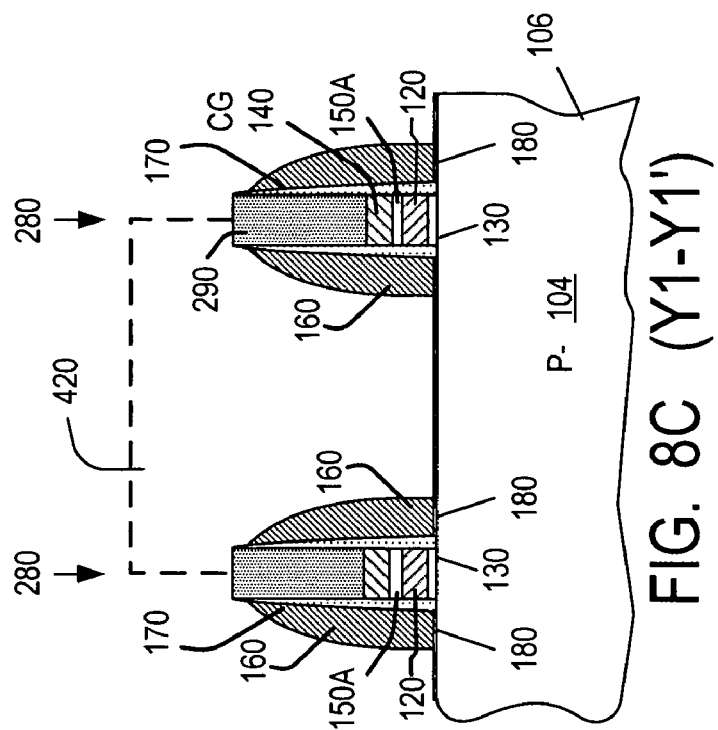
FIG. 8C (Y1-Y1')
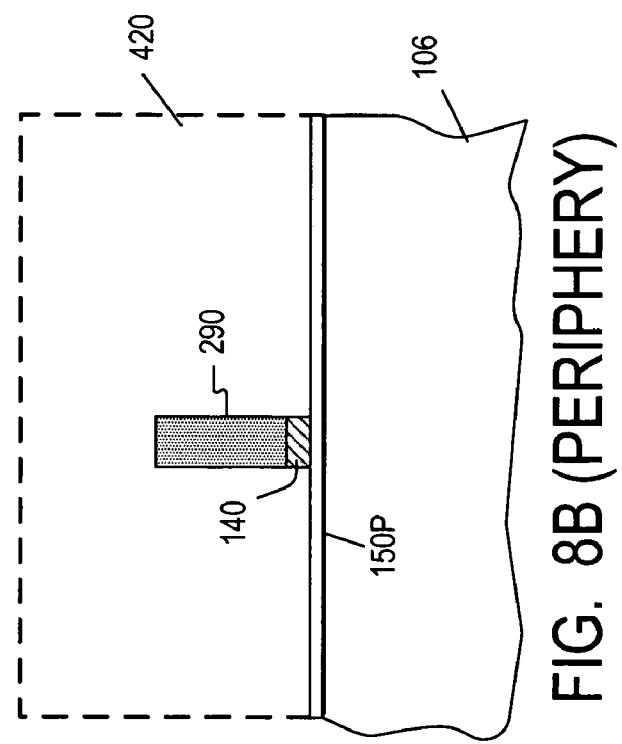
FIG. 8B (PERIPHERY)

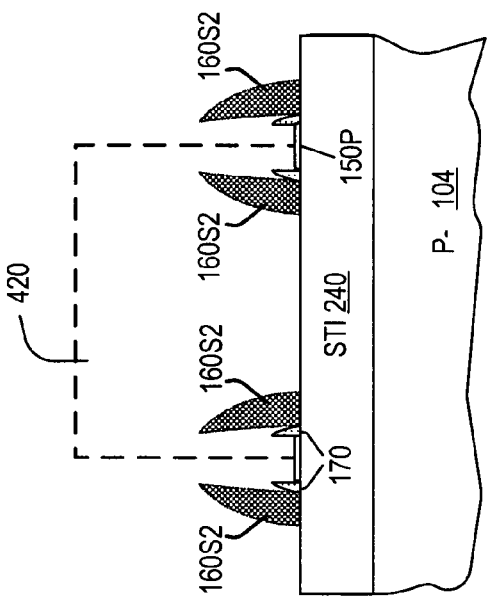
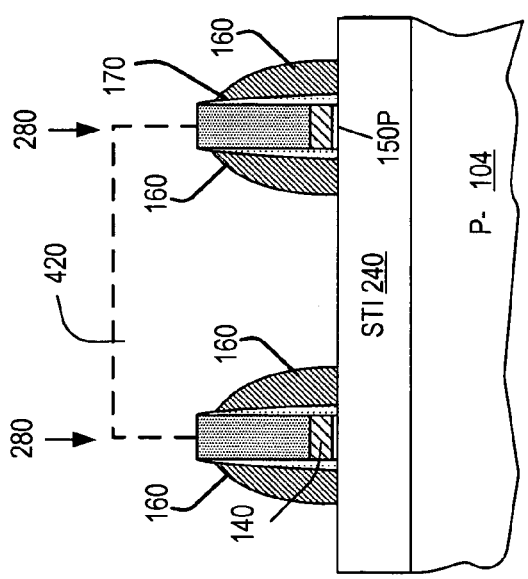
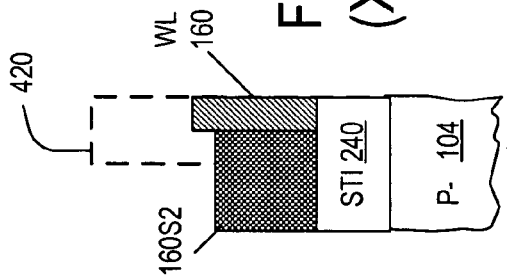

USE OF MULTIPLE ETCHING STEPS TO REDUCE LATERAL ETCH UNDERCUT

BACKGROUND OF THE INVENTION

The present invention relates to integrated circuits, and more particularly to reducing a lateral etch undercut.

In an integrated circuit fabrication process, a layer of material (e.g. a conductive layer, a dielectric, or a semiconductor layer) can be patterned by an isotropic etch. A masked isotropic etch may involve an undercut—the etchant may etch the layer laterally under the mask. The undercut can be undesirable. There is a need to impede or eliminate the undercut etching.

SUMMARY

This section summarizes some features of the invention. Other features are described in the subsequent sections. The invention is defined by the appended claims which are incorporated into this section by reference.

In some embodiments of the present invention, before an isotropic etch of a layer, another etch of the same layer is performed. This other etch can be anisotropic. This etch attacks a portion of the layer adjacent to the feature to be formed by the isotropic etch. That portion is entirely or partially removed by the anisotropic etch. Then the isotropic etch mask is formed to extend beyond the feature over the location of the portion subjected to the anisotropic etch. If that portion was removed entirely, then the isotropic etch mask may completely seal off the feature to be formed on the side of that portion, so the lateral etching will not occur. If that portion was removed only partially, then the isotropic etch mask will not necessarily completely seal off the feature to be formed, but the lateral undercut will be impeded because the passage to the feature under the isotropic etch mask will be narrowed.

Whether or not the portion has been removed entirely or only partially, the extension of the isotropic etch mask beyond the feature can be shortened.

The invention is not limited to isotropic or anisotropic etches.

Other features and advantages of the invention are described below. The invention is defined by the appended claims.

BRIEF DESCRIPTION OF THE DRAWINGS

FIGS. 2D, 2E, 2F show vertical cross sections of the memory of FIG. 1.

FIGS. 3, 4A, 4B, 4C, 5A, 5B, 5C, 6A, 6B, 6C show vertical cross sections of memory structures in the process of fabrication according to some embodiments of the present invention.

FIG. 7B shows a vertical cross section of a memory structure according to an embodiment of the present invention.

FIGS. 8B, 8C, 8D, 8E, 8F show vertical cross sections of memory structures according to some embodiments of the present invention.

DESCRIPTION OF SOME EMBODIMENTS

The embodiments described in this section illustrate but do not limit the invention. The invention is not limited to particular materials, process steps, or dimensions. The invention is defined by the appended claims.

Figure 2A:
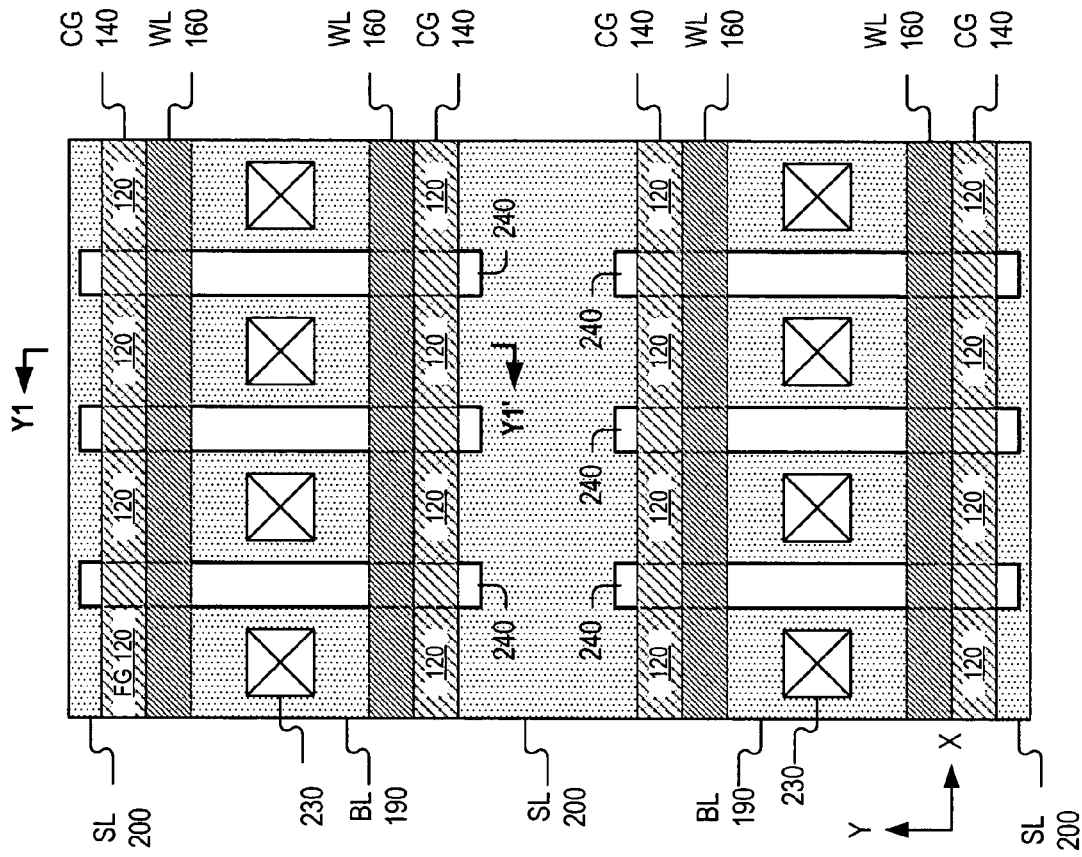
FIGS. 2A, 2B, 2C are top views of the memory of FIG. 1.
Figure 1:
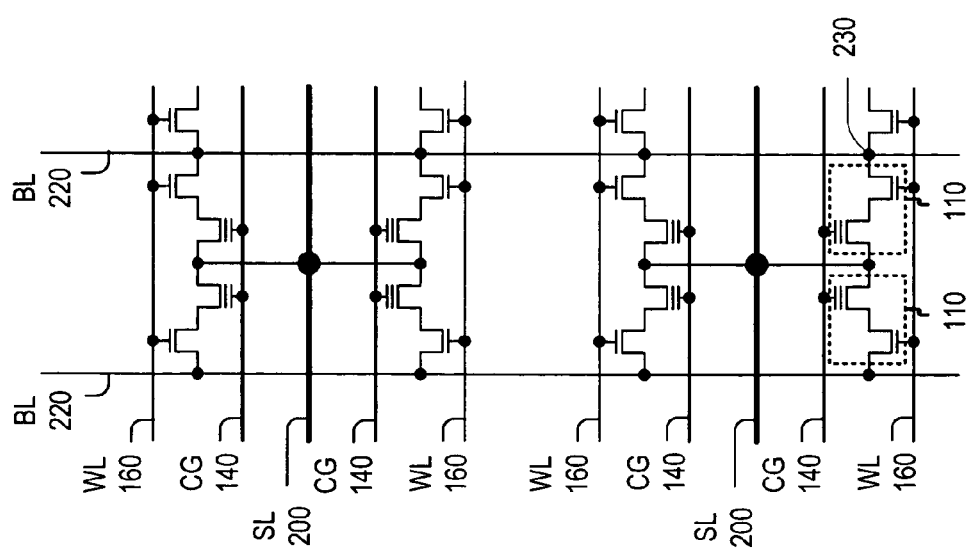
FIG. 1 is a circuit diagram of a nonvolatile memory according to one embodiment of the present invention.
Figure 2B:
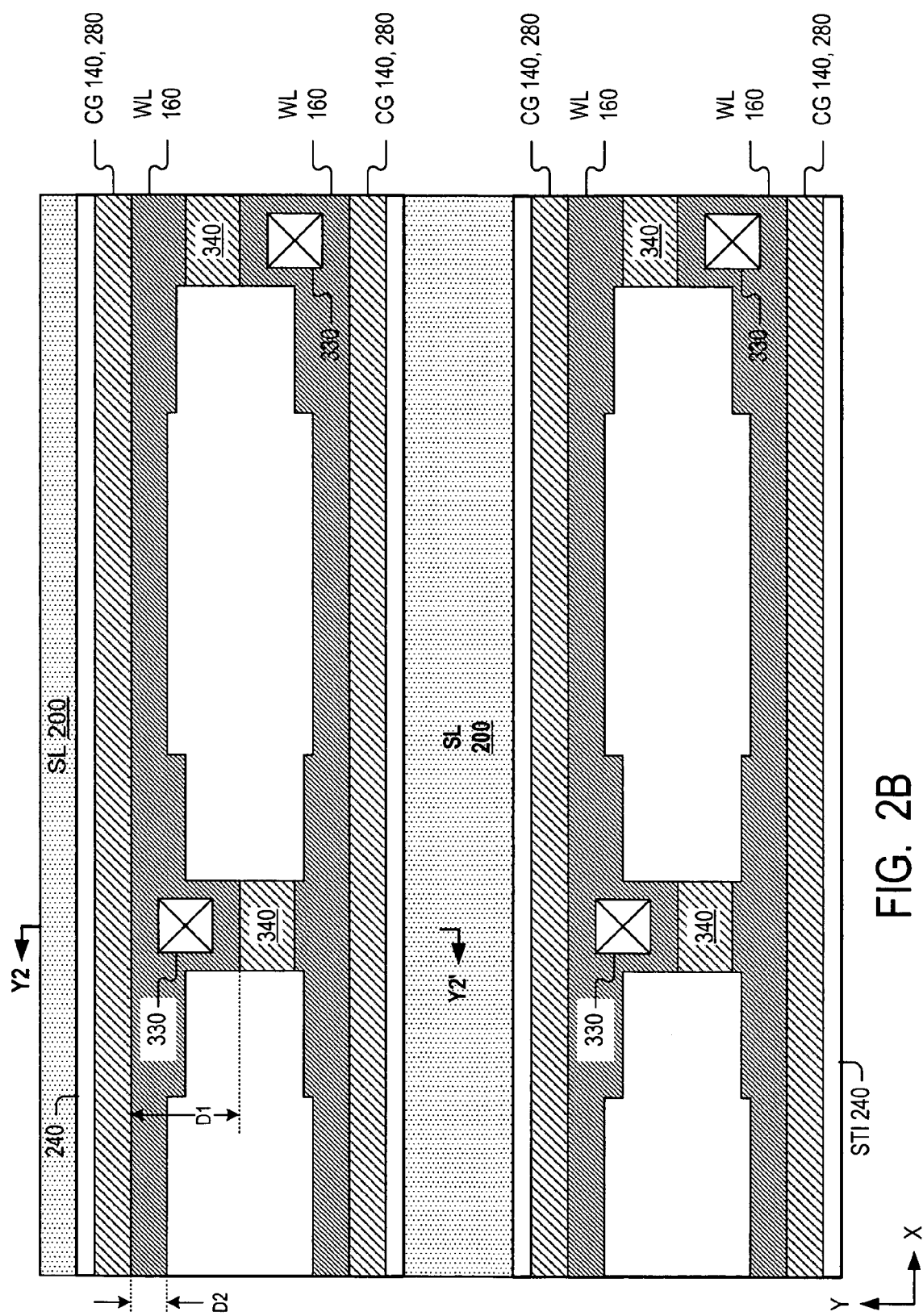
Figure 2C:
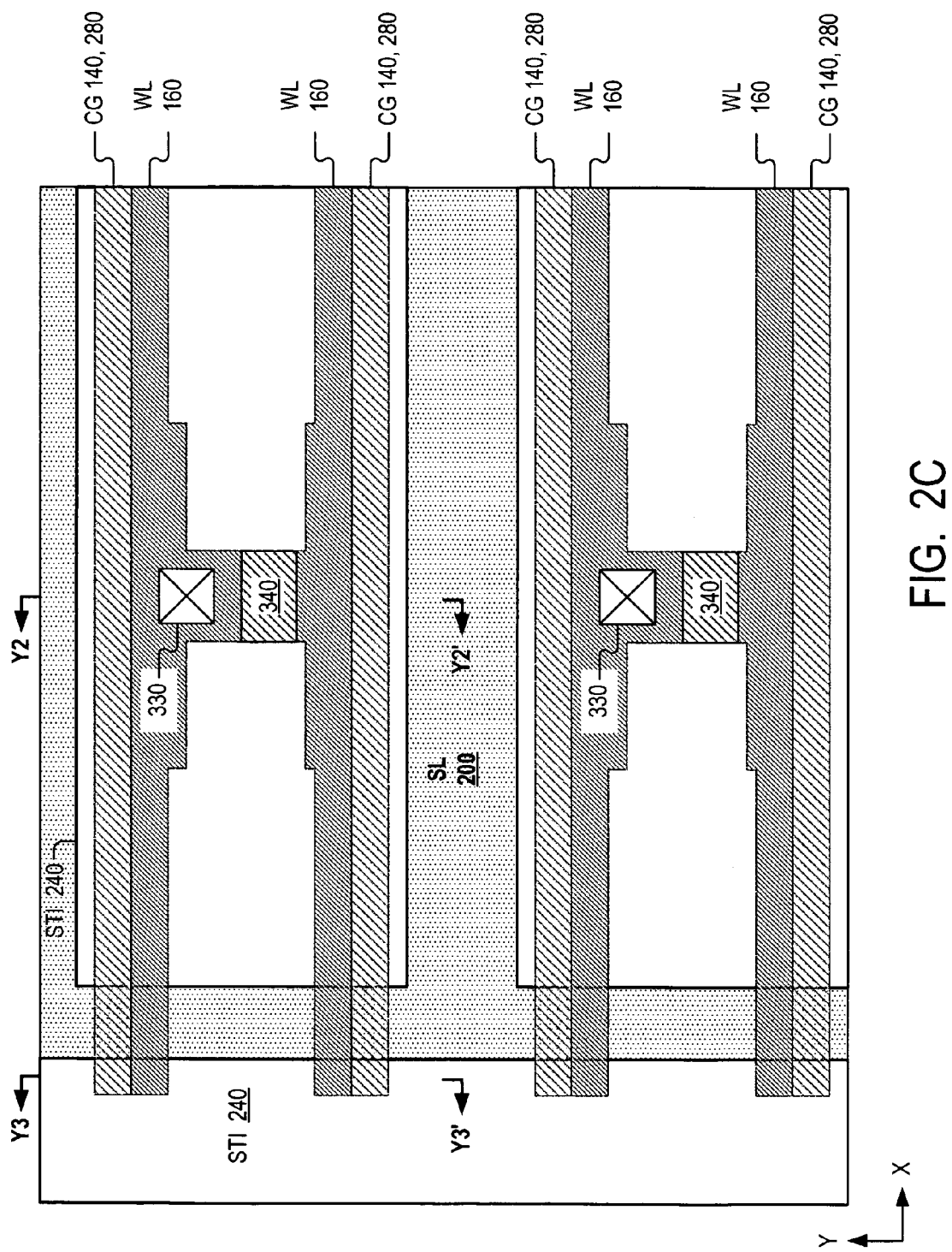

FIG. 1 is a circuit diagram of a flash memory array which will be used to illustrate some embodiments of the present invention. FIG. 2A is a top view showing some features of the memory of FIG. 1. FIG. 2B is a top view of an array area which has contact openings to the wordlines. FIG. 2C shows another area near the array boundary, possibly overlapping with the area of FIG. 2B. FIG. 2D shows a vertical cross section marked Y1–Y1' in FIG. 2A. FIG. 2E shows a vertical cross section marked Y2–Y2' in FIGS. 2B and 2C. FIG. 2F shows a vertical cross section marked Y3–Y3' (FIG. 2C).

The memory is fabricated in and over a P type well 104 (doped P−), as shown in FIGS. 2D, 2E, 2F. Well 104 is formed in a semiconductor substrate 106 (e.g. monocrystalline silicon) and isolated from the rest of the substrate by an N type region (not shown). Each memory cell 110 includes a conductive floating gate 120 insulated from P well 104 by dielectric 130. Control gate 140 overlies the floating gate. Control gate 140 is part of a conductive control gate line (e.g. polysilicon) that provides control gates for one row of the memory cells. The control gates are insulated from the underlying floating gates by dielectric 150A. In each row, a conductive wordline 160 provides the select gates for the memory cells. The wordline 160 is insulated from control gates 140 and floating gates 120 by dielectric 170, and from P well 104 by dielectric 180.

Each memory cell 110 has two N+ source/drain regions 190, 200 in P well 104. Region 200 ("source line" region), adjacent to floating gate 120, is part of an N+ source line. The source lines run in the row direction (X direction in FIG. 2A). Each source line 200 is shared by two adjacent rows.

In each column of the memory cells, "bitline regions" 190 are connected to a bitline 220 (FIG. 2D). The bitline is formed from an overlying conductive layer 224. The contact openings to bitline regions 190 are shown at 230 in FIGS. 2A and 2D.

Isolation trenches 240 (FIGS. 2A, 2B, 2C, 2E, 2F) are formed in substrate 106 between adjacent columns of the memory cells by a shallow trench isolation process (STI). Each trench 240 extends across two memory rows between two respective source lines 200. The trenches are filled with dielectric. We will use the same numeral 240 for the trenches and the dielectric filling the trenches. As shown in FIG. 2E, the dielectric totally fills the trenches and projects above the trenches. In other embodiments, the dielectric is limited to the trenches, and may or may not totally fill the trenches.

In FIG. 1, each cell 110 is represented as a floating gate transistor and a select gate transistor connected in series. This diagram is not a precise representation of the memory because the channel regions of the floating gate transistor and the select transistor are merged together. (The channel region of the floating gate transistor is a P type region in well 104 under the floating gate 120. The channel region of the select transistor is a P type region in well 104 under select gate 160.) There is no N type region between the two channel regions. Other embodiments include an N type region between the two channel regions. Of note, some embodiments are non-flash EEPROM memories.

Each wordline 160 is formed as a spacer on a sidewall of a row structure 280 which includes dielectric 130, floating gates 120, dielectric 150A, and control gate line 140 for the corresponding row of the memory cells. Row structure ("control gate structure") 280 also includes a silicon nitride layer 290 formed on top of control gate line 140 to protect the control gate 140 during an etch of wordline layer 160. Nitride 290 is not shown in FIGS. 2A–2C. Row structure 280 includes dielectric spacers 170 separating the control gate line 140 and the floating gates 120 from wordline 160. Each row structure 280 projects upward over the top surface of substrate 106 and trench dielectric 240. Dielectric spacers 170 form a dielectric sidewall of each control gate structure 280. The wordline 160 overlies one such sidewall in each row.

Dielectric 310 (FIGS. 2D, 2E, 2F) overlies the control gate structures 280 and the wordlines 160. Conductive layer 224 from which the bitlines are formed overlies the dielectric 310. Dielectric 314 overlies the conductive layer 224. A layer 320 overlies dielectric 314. Contact openings 330.1 (FIG. 2E) in dielectric 310 and contact openings 330.2 in dielectric 314 allow an electrical path to be formed between wordlines 160 and layer 320. These openings are shown in FIGS. 2B, 2E at 330. Conductive plugs 224P are formed in openings 330.1. These plugs contact the wordlines 160. Layer 320 contacts the plugs 224P through openings 330.2. In one embodiment, layer 320 is a conductive layer patterned to form strap lines to reduce the resistance between different wordline portions. Each strap line 320 runs over the corresponding wordline 160 and electrically contacts the wordline through openings 330.1, 330.2 at periodic intervals along the memory row. See U.S. patent application Ser. No. 09/972,388 filed Oct. 5, 2001 (published as no. 2003/0067806 on Apr. 10, 2003), incorporated herein by reference. In some embodiments, the layer 320 has a lower resistivity, a lower sheet resistance, and a lower resistance per unit length than the wordline layer 160. The invention is not limited to the use of strap lines. Also, in some embodiments, the strap lines are formed on dielectric 310; plugs 224P are omitted; bitlines 220 overlie the layer 320.

Making contacts to wordlines 160 is facilitated by pedestals 340 (FIGS. 2B, 2C, 2E) formed adjacent to control gate structures 280 near contact openings 330.1. The pedestals project upward over the top surface of substrate 106 and trench dielectric 240. Wordlines 160 overlie the pedestals. At pedestals 340, the wordline does not form a spacer but stretches between the dielectric sidewall 170 of structure 280 and the pedestal and reaches the pedestal. The pedestals change the profile of the top surface of wordlines 160 near openings 330.1. The top surface of the wordlines is raised up, so the openings 330.1 do not have to be as deep. Also, the minimum thickness of wordlines 160 is increased near the openings. The increased thickness counteracts the loss of layer 160 during the etch of openings 330.1. Consequently, the etch process margin is increased, the photolithographic alignment tolerances are relaxed when the openings are patterned, and the wordline contact resistance tends to be lower.

In the embodiment being described, pedestals 340 are formed from the layers 150A, 140, 290, 170 used also to form the structures 280. In other embodiments, pedestals 340 include layers not present in structures 280.

In the embodiment of FIGS. 2A–2F, pedestals 340 are dummy structures, i.e. they do not have any electrical functionality. In particular, the portions of conductive layer 140 in pedestals 340 are dummy elements (having no electrical functionality) rather than circuit elements.

In this embodiment, the wordlines are widened near the openings 330 because the distance D1 (FIG. 2B) between the wordline and the adjacent pedestal is greater than the width D2 of the wordline spacer. The distance D1 is large enough to accommodate the opening 330. In other embodiments, the wordlines are not widened near the contact openings. The invention covers embodiments in which the wordlines' width remains unchanged near the contact openings (D1=D2), and embodiments in which the wordlines are narrower near the contact openings (D1<D2). If D1 is small, the contact openings 330 may overlie the adjacent pedestals 340 and/or the control gate lines 140.

In the embodiment of FIGS. 2A–2 F, contact openings 330 are located at a boundary of the memory array, in an area where there are no floating gates. Openings 330 can also be located in gaps in the memory array (see U.S. Pat. No. 6,355,524 issued Mar. 12, 2002 to Tuan et al., and U.S. patent application Ser. No. 10/402,698 filed Mar. 28, 2003 by Chung et al., both incorporated herein by reference). There are no memory cells (no floating gates) in the gaps. Control gate lines 140 and source lines 200 run uninterrupted through the gaps or the array boundary. Placing the contact openings 330.1, 330.2 in areas with no floating gates is done to avoid a short between the wordline contacts and the bitline contacts in openings 230. These gaps or array boundary areas are formed over STI regions 240. These layout features are optional.

The cross section Y1–Y1' (FIG. 2A) passes in the Y direction (column direction) through an active area of a memory cell and through a bitline contact opening 230. Cross section Y2–Y2' (FIGS. 2B, 2C) passes in the Y direction through a pedestal 340 and a contact opening 330. Cross section Y3–Y3' (FIG. 2C) passes in the Y direction near the ends of control gate lines 140.

In one embodiment, the memory is fabricated as follows. P well 104 is isolated by N type dopant implantation. Dielectric 130 ("tunnel oxide") is formed on substrate 106. In one embodiment, dielectric 130 is a 9 nm thick layer of silicon dioxide. (The dimensions and materials are given for illustration and are not limiting.) A doped polysilicon layer 120 is deposited on oxide 130. The thickness of layer 120 is 120–200 nm. Then a silicon nitride mask (not shown) is formed on layer 120 to define isolation trenches 240. Polysilicon 120, oxide 130, and substrate 106 are etched where exposed by this mask, so that the isolation trenches 240 are formed. Trenches 240 are filled with a suitable dielectric (e.g. silicon dioxide). See FIG. 3 (cross section Y2–Y2'). The nitride mask is removed. Optionally, dielectric 240 is etched to lower its top level below the top surface of polysilicon 120.

Isolation regions 240 are also formed in the peripheral area (not shown) during these steps.

Then dielectric layer 150A is formed on polysilicon 120 in the memory array area. See FIG. 4A (cross section Y1–Y1') and FIG. 4B (cross section Y2–Y2'). Also, polysilicon 120 and oxide 130 are removed in the periphery, and gate dielectric layer 150P (FIG. 4C) is formed on substrate 106 in the peripheral active area for the peripheral transistors. In one embodiment, dielectric 150A is ONO, i.e. a sandwich of silicon dioxide, silicon nitride, and silicon dioxide. Exemplary thickness values of the oxide, nitride, oxide layers are 30–60 Å, 60–100 Å, and 30–60 Å respectively. Dielectric 150P is silicon dioxide. In one embodiment, before the removal of layers 120 and 130 in the periphery, the first 30–60 Å oxide layer for ONO 150A is formed over the whole wafer, and then the 60–100 Å nitride layer is formed. Then the array is masked, and the periphery is etched to remove the nitride layer, the oxide layer, the polysilicon 120, and the oxide 130. Substrate 106 becomes exposed in the peripheral active areas (the areas not occupied by isolation regions 240). Then the array mask is stripped, and a silicon dioxide layer is deposited to over the whole wafer a thickness of 30–60 Å. This layer provides the top oxide for ONO 150A, and also provides part of the gate oxide 150P for high voltage peripheral transistors. Then a photoresist mask (not shown) is formed to cover the array and the high voltage peripheral active areas, and the oxide is etched off from the low voltage peripheral active areas to expose the substrate 106. The photoresist is removed, and the structure is oxidized to grow the gate oxide 150P in the low voltage peripheral active areas, to increase the gate oxide thickness in the high voltage peripheral active areas, and to slightly increase the oxide thickness at the top of ONO 150A.

Other processes to form the dielectric layers 150A, 150P are also possible. The thickness of dielectric 150P can be different for different transistors. For example, a thicker dielectric can be provided for the high voltage transistors. See the aforementioned U.S. Pat. No. 6,355,524.

Doped polysilicon 140 is deposited on dielectric 150A, 150P to a thickness of 100–250 nm for example. Silicon nitride 290 is deposited on polysilicon 140. An exemplary thickness of nitride 290 is 100–300 nm.

A photoresist layer 370 is deposited and patterned to define the control gate lines 140 and the pedestals 340. Silicon nitride 290 is removed where exposed by resist 370. The photoresist can optionally be removed, with the silicon nitride 290 acting as a hard mask. Polysilicon 140 and dielectric 150A are etched away where exposed by nitride 290. Then the exposed portion of polysilicon 120 and some of the underlying dielectric 130 are etched away. See FIG. 5A (cross section Y1–Y1') and FIG. 5B (cross section Y2–Y2'). The periphery is protected by resist 370 during the etch of nitride 290, so the periphery remains unchanged.

Resist 370 is removed. The exposed sidewalls of polysilicon layers 120, 140 are oxidized, and then thin silicon nitride spacers are formed on the sidewalls of structures 280, to produce dielectric 170. Dielectric 170 also forms on the sidewalls of pedestals 340 (FIG. 5B). The exposed portions of oxide 130 are etched away.

Gate dielectric 180 (silicon dioxide) is grown on substrate 106 for the select transistors. Polysilicon 160 is deposited over the structure (this can be done by low pressure chemical vapor deposition, i.e. LPCVD), and is heavily doped during or after the deposition. Polysilicon 160 fills the areas between the pedestals 340 and the adjacent control gate structures 280. In some embodiments, the deposition process is conformal, and the thickness of layer 160 exceeds half the distance between the pedestal 340 and the adjacent structures 280. In one embodiment, polysilicon 160 is about 300 nm thick. Pedestals 340 make the profile of polysilicon 160 more lateral (less sloped) in the areas between the pedestals and the structures 280, and the minimum polysilicon thickness is increased in these areas.

Polysilicon 160 is planar over the peripheral active areas (FIG. 5C) because the underlying layers 290, 140, 150P are planar in these areas. These layers may have a non-planar topography at the boundary between the active areas and the substrate isolation areas (not shown in FIG. 5C).

Polysilicon 160 is subjected to an anisotropic, preferentially vertical etch (e.g. reactive ion etching, RIE) without a mask. The lateral etch rate may or may not be zero, but it is less than the vertical etch rate. The etch forms spacers on the sidewalls of structures 280 and pedestals 340. See FIG. 6A (cross section Y1–Y1') and 6B (cross section Y2–Y2'). The etch stops on oxide 180 in the active areas of the array.

Polysilicon 160 is entirely removed from the periphery during this etch. See FIG. 6C.

Figure 7A:
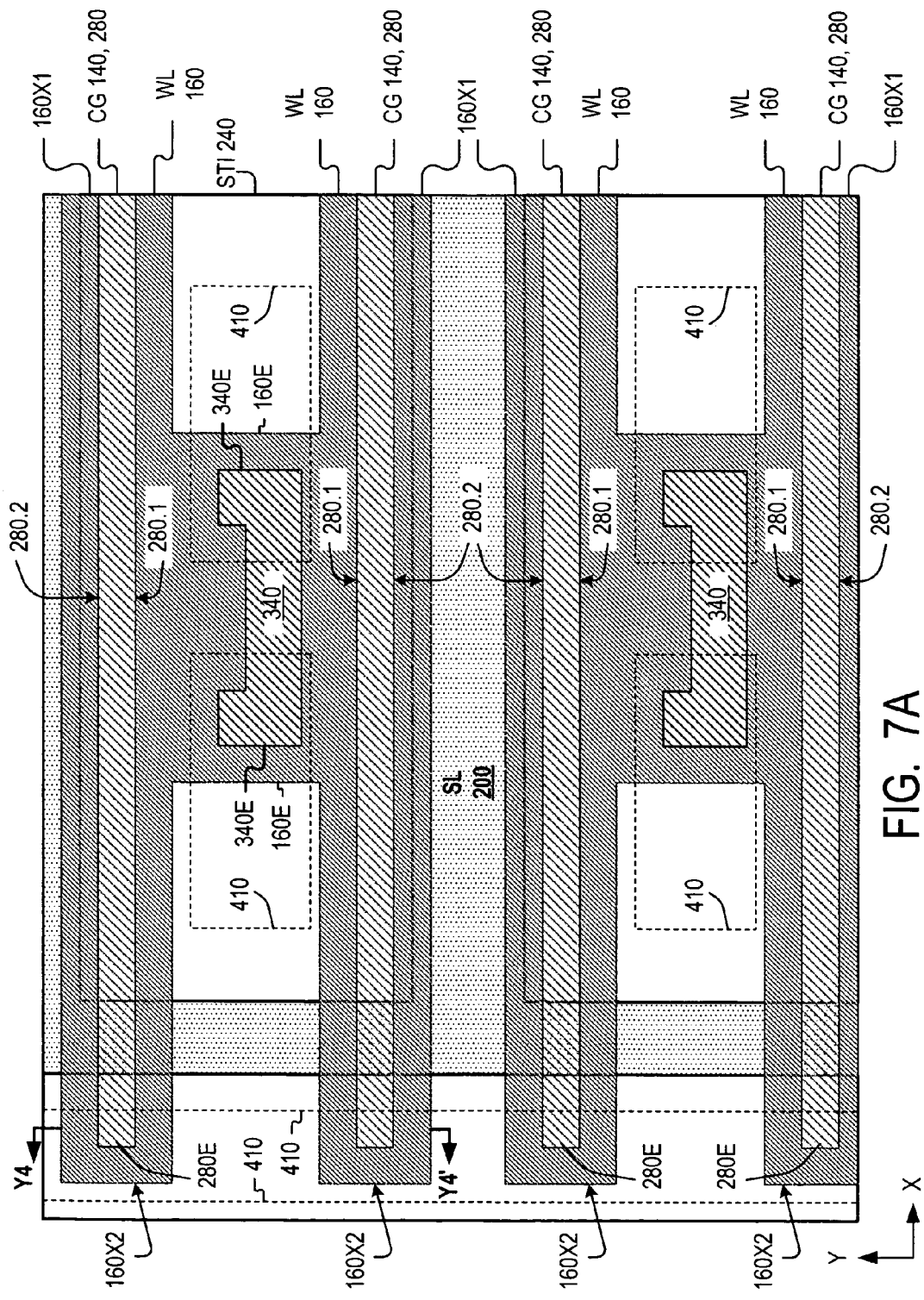
FIG. 7A is a top view of a memory structure according to an embodiment of the present invention.

FIG. 7A is a top view of the resulting structure in the memory array area near the pedestals 340. Polysilicon 160 forms sidewall spacers over the sidewalls of control gate structures 280. Each structure 280 has a sidewall 280.1 facing the pedestals 340, the opposite sidewall 280.2, and two end portions 280E at the opposite ends of structure 280 (only one end portion 280E is shown in FIG. 7A for each structure 280). Polysilicon layer 160 includes the wordline spacers formed over sidewalls 280.1, and also includes spacers 160X1 over sidewalls 280.2. Spacers 160X1 will be removed as described below. Layer 160 also includes spacers 160X2 at the end portions 280E. Each spacer 160X2 runs around the end portion 280E and meets the spacer 160X1 and the wordline portion of polysilicon 160. Some, but not necessarily all, of polysilicon 160X2 will be removed, as described below.

Each pedestal 340 physically contacts two adjacent wordlines 160. The anisotropic etch of polysilicon 160 forms polysilicon spacers 160E around the edges 340E of pedestals 340. These spacers are marked 160E. Each spacer 160E shorts together two adjacent wordlines 160. This short will be eliminated as described below.

A photoresist mask 410 is formed photolithographically over the wafer to define the gates of the peripheral transistors (FIG. 7B). These gates will be formed by an anisotropic etch of nitride 290 and polysilicon 140. In addition, the mask openings may expose the polysilicon 160E (FIG. 7A). Polysilicon 160E does not have to be completely removed by the etch through mask 410, but will be removed at least partially, as described in more detail below. The openings over the polysilicon 160E overlap the pedestals 340.

Additional mask openings overlie the polysilicon spacers 160X2. These openings overlap the ends 280E of control gate structures 280. At each end 280E, part of polysilicon 160X2 overlies the sidewall 280.2 (this part is contiguous with polysilicon spacer 160X1), and another part overlies the sidewall 280.1 (this part is contiguous with wordline 160). The part of spacer 160X2 over sidewall 280.1 is at least partially removed by the etch through mask 410 in order to protect the wordlines during the subsequent isotropic etch of spacers 160X1, as described below.

Figure 8A:
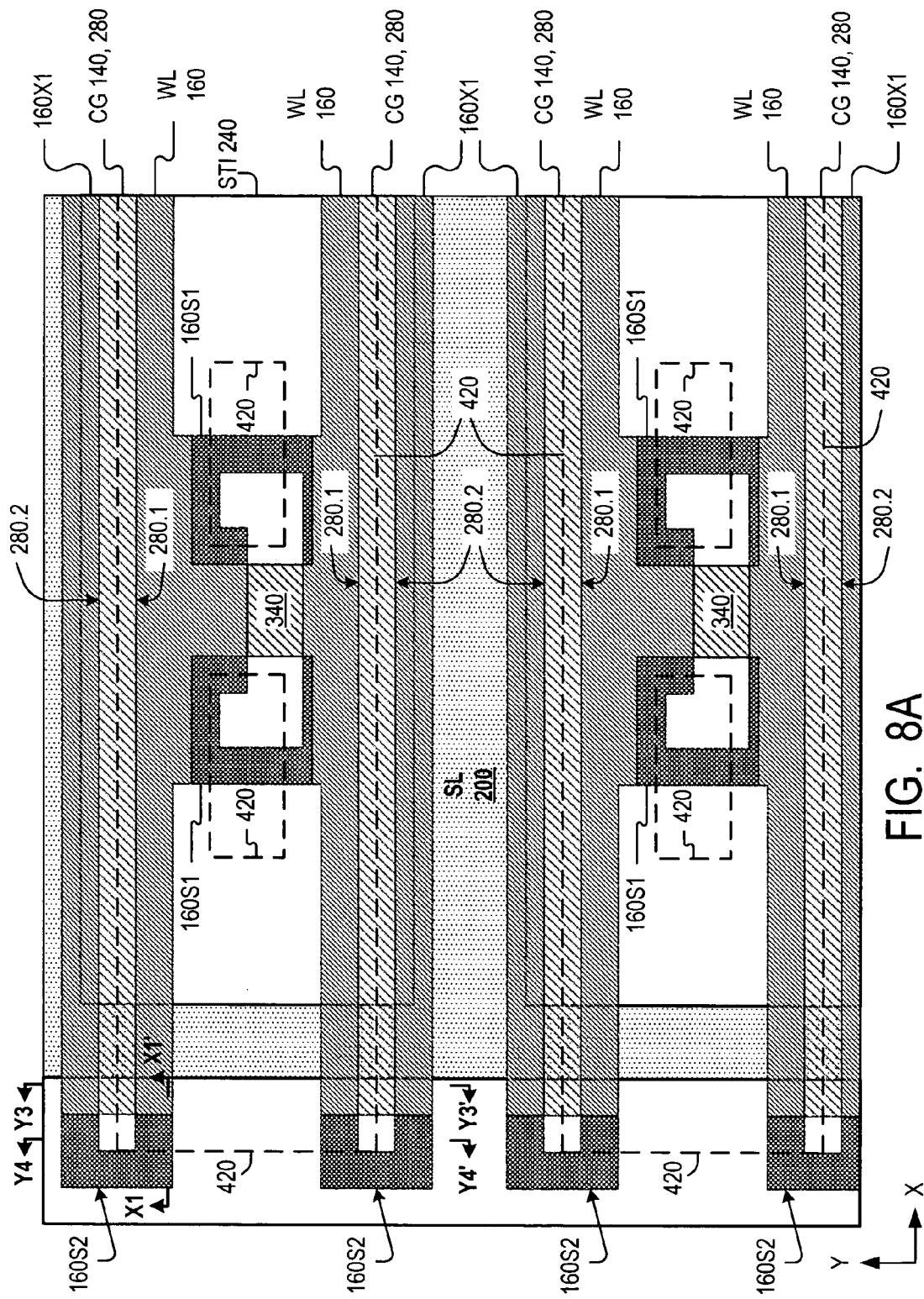
FIG. 8A is a top view of a memory structure according to an embodiment of the present invention.

Nitride 290 (FIG. 7B) and polysilicon 140 are etched anisotropically through the openings in mask 410 to form the peripheral transistor gates. The polysilicon etch attacks the exposed polysilicon 160E, 160X2 (FIG. 7A). Also, the nitride and polysilicon etches remove the ends of control gate structures 280 and pedestals 340. The resulting structure is shown in FIGS. 8A (top view), 8B (periphery), 8D (cross section Y3–Y3'), and 8E (cross section Y4–Y4' marked in FIGS. 7A, 8A, passing in the Y direction through the location of the removed portions of control gate structures 280). The active areas of the memory cells remain unchanged, as shown in FIG. 8C (cross section Y1–Y1').

As illustrated in FIG. 8E, dielectric 170 can be partially removed by the etch of nitride 290.

Polysilicon portions 160E, 160X2 do not have to be completely removed during the etch of polysilicon 140. Polysilicon spacers 160 can be thicker (taller) than the polysilicon 140, and the etch may terminate before the exposed polysilicon 160 is completely removed. In one embodiment, polysilicon spacers 160 are 240–360 nm thick, and polysilicon 140 is only 80–200 nm thick. FIG. 8A shows a possible residue ("stringers") of polysilicon 160E as 160S1, and a possible residue of polysilicon 160X2 as 160S2. See also FIGS. 8E and 8F. FIG. 8F shows a cross section XI –XI' marked in FIG. 8A, passing in the X direction through wordline 160 and the polysilicon stringer 160S2.

Due to the etch of polysilicon spacers 160, the spacers become reduced in height, and can also be reduced in width. For example, the width of spacer 160S2 can be smaller than D2 (FIG. 2B).

Resist 410 is stripped. A photoresist mask 420 (FIGS. 8A–8F) is formed photolithographically over the wafer to remove the polysilicon 160X1. The mask openings may expose the entire source lines 200 because the source lines are protected by oxide 180 (FIG. 8C). The edges of the mask openings are positioned over the adjacent control gate structures 280.

Figure 9:
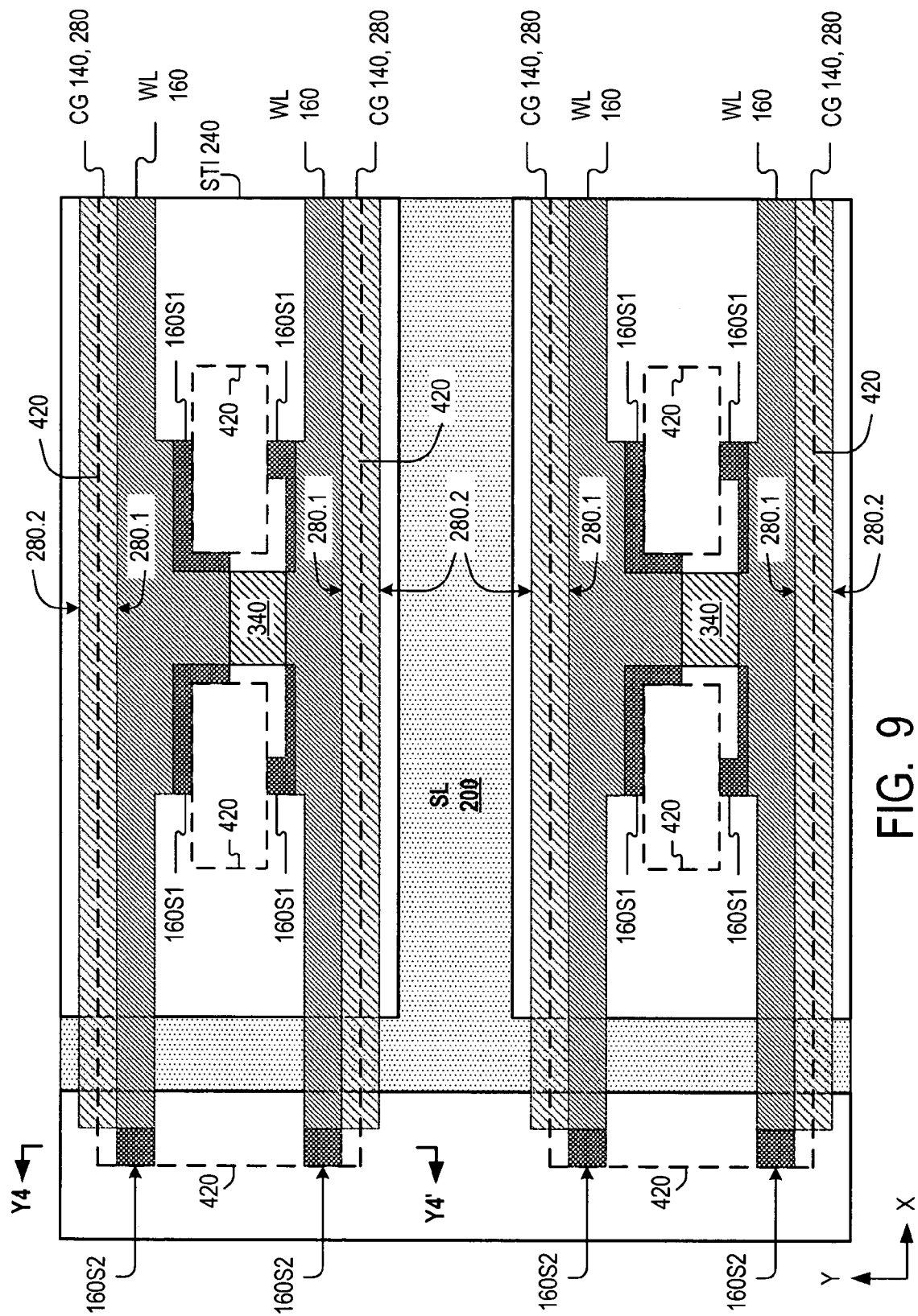
FIGS. 9, 10 are top views of memory structures according to some embodiments of the present invention.

FIG. 9 is the top view of the structure immediately after the polysilicon etch through mask 420.

Mask 420 also has openings over portions of polysilicon stringers 160S1 (FIGS. 8A, 9). The etch removes the exposed polysilicon 160S1 to eliminate the short between the wordlines.

In some embodiments, the polysilicon etch is isotropic. Mask 420 extends beyond the ends of wordlines 160 near the control gate structure sidewalls 280.1 (FIGS. 8A, 8F). This is done to prevent the lateral etch of the wordlines under the resist 420. The presence of polysilicon residue 160S2 under the resist is undesirable because the etchant can remove this residue and reach the wordlines. However, since the residue 160S2 has a smaller cross-sectional area than the original polysilicon spacers 160X2 (FIG. 7A), it is more difficult for the etchant to remove the residue and attack the wordlines because the etchant has to work through a narrower passage occupied by the residue under the resist. This advantage (a narrower passage) is obtained due to the design of mask 410 (FIG. 7A) which exposed the polysilicon 160X2 over the sidewalls 280.1.

As shown in FIG. 9, some polysilicon residue 160S1, 160S2 may remain in the final structure. Polysilicon 160S2 may form an extension of wordline 160. This extension may be contiguous with the wordline.

FIGS. 2B, 2C do not show the polysilicon residue. In some embodiments, no reside is left after the etch through mask 410.

Resist 420 covers the entire periphery, so the periphery is not affected by the etch through mask 420.

The remaining fabrication steps can be similar to those described in the aforementioned U.S. Pat. No. 6,355,524 and U.S. patent application Ser. No. 10/402,698. Briefly, dopant implantation steps are performed to create source line regions 200 and bitline regions 190 (FIG. 2A, 2D, 2E). Interlayer dielectric (e.g. phosphosilicate glass, PSG) 310 is deposited over the wafer, and polished back using chemical mechanical polishing (CMP). See FIGS. 2D, 2E. Contact openings 230, 330.1 are etched in dielectric 310. Conductive layer 224 (e.g. tungsten) is deposited and patterned to form bitlines 220 and plugs 224P.

Dielectric 314 is formed over the structure. Contact openings 330.2 (FIG. 2E) are etched in dielectric 314. Metal 320 is deposited and patterned to provide strap lines for wordlines 160.

In an exemplary embodiment, the height of each pedestal 340 is 240–360 nm. (The height of pedestals 340 is the combined thickness of layers 150, 140, 290). The height of each control gate structure 280 over the trench dielectric 240 is also 240–360 nm. The initial thickness of polysilicon layer 160 is 200–300 nm. After the anisotropic etch the polysilicon spacers 160 are at most as high as the structures 280 in some embodiments. Therefore, in the area of trenches 240, the spacers 160 are at most 240–360 nm in height. In the area of pedestals 240, the minimal thickness of wordlines 160 is 60–200 nm. The etch of openings 330.1 is therefore shortened.

Figure 10:
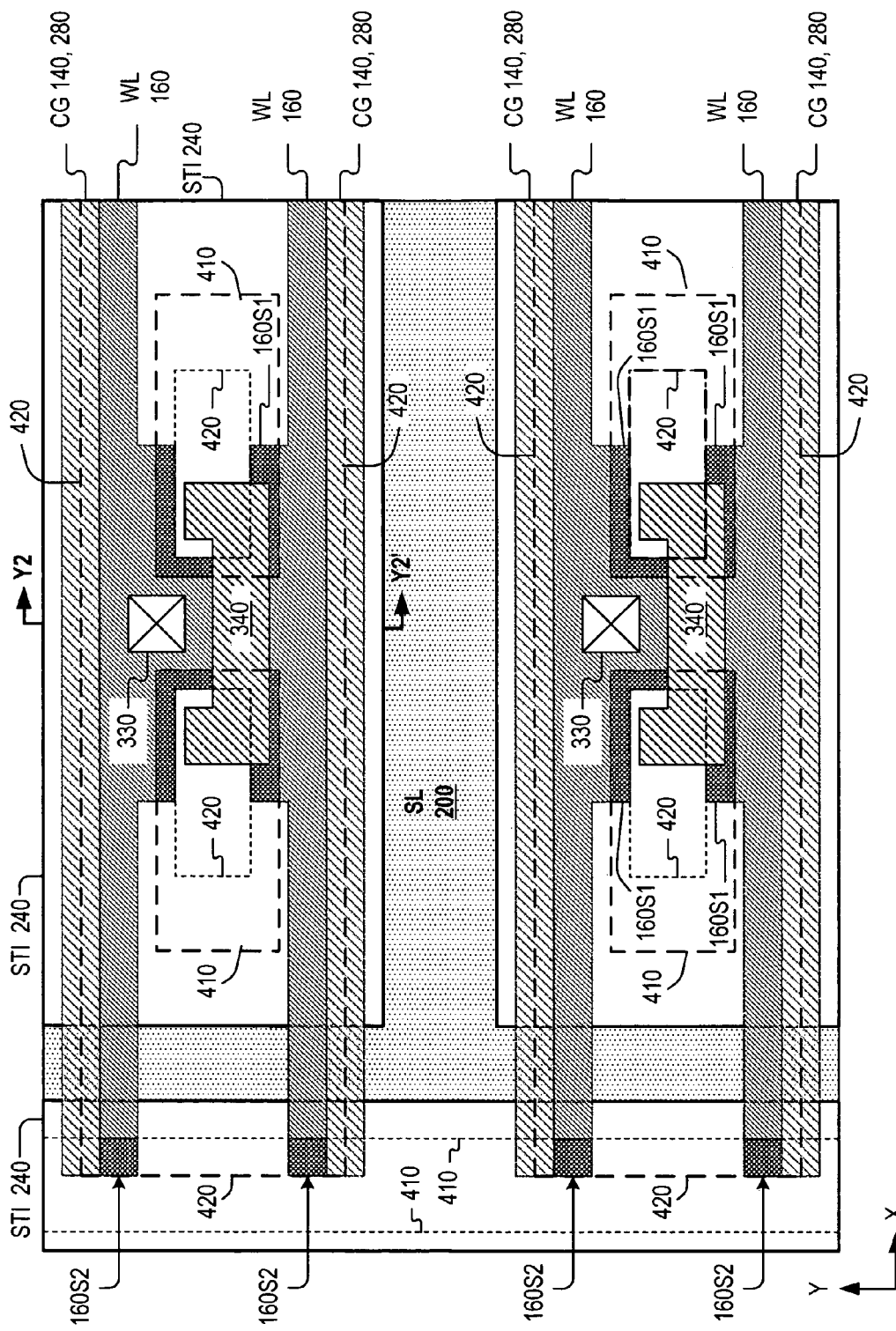

FIG. 10 illustrates another embodiment. Masks 410, 420 have the same geometry in the array area as in FIGS. 7A, 8A, but the etch through mask 410 is not used to pattern the peripheral transistor gates. The etch through mask 410 etches the polysilicon but not the silicon nitride. Control gate structures 280 and the pedestals 340 are protected by nitride 290 and hence are not affected by this etch.

The structure of FIG. 10 can also be obtained if the etch through mask 410 patterns the peripheral transistor gates but the nitride 290 is removed from the periphery before this etch.

The invention is not limited to the embodiments described above. The invention is not limited to the particular materials, process parameters or layer thicknesses. The etch through mask 420 may pattern the wordlines only partially, with the final patterning accomplished by subsequent etches. The invention is applicable to other memory circuits and memory cell structures. For example, isolation trenches 240 are optional. Other isolation techniques can be used (e.g. LOCOS). Further, the memory may have no control gates. See R. Mih et al., "0.18 um Modular Triple Self-Aligned Embedded Split-Gate Flash Memory", 2000 Symposium on VLSI Technology, Digest of Technical Papers, pages 120–121 incorporated herein by reference. FIGS. 2B and 2C show a single contact opening 330 at each pedestal 340, but the memory may contain any number of the openings 330 at each pedestal. Openings 330 can be provided on both sides of the pedestal to contact the two respective wordlines. The memory may be programmed or erased through P well 104 or wordlines 160 or by other mechanisms, known or to be invented. Other embodiments and variations are within the scope of the invention, as defined by the appended claims.

The invention claimed is:

1. A method for manufacturing an integrated circuit, the method comprising:
   (i) forming a first layer comprising a first portion and a second portion, wherein the first portion is to provide a first feature of the integrated circuit, and the second portion physically contacts the first portion at the location of the first feature;
   (ii) forming a first mask over the first layer, the first mask overlying the first portion but having an opening over the second portion so as not to cover the second portion;
   (iii) etching the second portion selectively to the first mask to at least partially remove the second portion;
   (iv) after the operations (ii) and (iii), forming a second mask over the first layer, the second mask covering the first and second portions; and
   (v) etching the first layer selectively to the second mask, wherein the etching of the first layer comprises lateral etching of the first layer.

2. The method of claim 1 wherein the operation (v) is isotropic etching of the first layer.

3. The method of claim 1 wherein the etching operation (iii) comprises anisotropic etching of the second portion.

4. The method of claim 1 further comprising, before forming the first layer, forming at least one first structure projecting upward over a semiconductor substrate in the integrated circuit;
- wherein the first and second portions are sidewall spacers formed over a sidewall or sidewalls of the first layer.

5. The method of claim 1 further comprising, before forming the first layer, forming at least one first structure projecting upward over a semiconductor substrate in the integrated circuit, each first structure comprising a first sidewall and a second sidewall;
- wherein the first portion of the first layer overlays the first sidewall of the first structure;
- wherein the first layer further comprises a third portion over the second sidewall of the first structure;
- wherein the operation (v) removes the third portion.

6. The method of claim 5 wherein the operation (i) comprises anisotropically etching the first layer to form spacers over the first and second sidewalls of the first structure.

7. The method of claim 5 wherein the first and second sidewalls are dielectric sidewalls.

8. The method of claim 1 wherein the integrated circuit comprises an additional feature at least partially patterned by the etching operation (iii).

9. The method of claim 8 wherein the additional feature is a transistor gate.

10. The method of claim 1 wherein the operation (iii) removes the second portion only partially.

11. The method of claim 1 wherein the first portion is conductive.

12. The method of claim 1 wherein the first feature is a memory wordline.

* * * * *

UNITED STATES PATENT AND TRADEMARK OFFICE
CERTIFICATE OF CORRECTION

PATENT NO. : 7,071,115 B2  Page 1 of 1
APPLICATION NO. : 10/772932
DATED : July 4, 2006
INVENTOR(S) : Chunchieh Huang et al.

It is certified that error appears in the above-identified patent and that said Letters Patent is hereby corrected as shown below:

Col. 7, line 45, delete "reside" and insert --residue--

Signed and Sealed this

Twenty-second Day of January, 2008

JON W. DUDAS
*Director of the United States Patent and Trademark Office*